United States Patent [19]

Masujima et al.

[11] Patent Number: 4,829,663
[45] Date of Patent: May 16, 1989

[54] METHOD OF MOUNTING SURFACE-MOUNTED TYPE ELECTRONIC COMPONENTS ON A PRINTED CIRCUIT BOARD

[75] Inventors: Sho Masujima; Hiroshi Yagi; Masakazu Kamoshida; Atsuzo Tamashima, all of Tokyo, Japan

[73] Assignee: TDK Corporation, Tokyo, Japan

[21] Appl. No.: 173,076

[22] Filed: Mar. 25, 1988

[30] Foreign Application Priority Data

Mar. 25, 1987 [JP] Japan .................................. 62-71234

[51] Int. Cl.⁴ ............................................. H05K 3/24
[52] U.S. Cl. ........................................ 29/840; 29/740; 414/417
[58] Field of Search ............... 228/180.2; 29/840, 740; 414/417

[56] References Cited

U.S. PATENT DOCUMENTS

| | | | |
|---|---|---|---|
| 4,327,482 | 5/1982 | Araki et al. | 29/740 |
| 4,437,232 | 3/1984 | Araki et al. | 29/740 |
| 4,489,487 | 12/1984 | Bura | 29/840 |
| 4,494,902 | 1/1985 | Kuppens et al. | 29/740 X |
| 4,606,117 | 8/1986 | Takahashi et al. | 29/832 X |
| 4,670,976 | 6/1987 | Stridsberg et al. | 29/740 |
| 4,675,993 | 6/1987 | Harada | 29/740 |

FOREIGN PATENT DOCUMENTS

| | | | |
|---|---|---|---|
| 82559 | 6/1983 | European Pat. Off. | 29/740 |
| 56-67768 | 6/1981 | Japan | 29/740 |
| 61-162423 | 7/1986 | Japan | 414/417 |

Primary Examiner—Howard N. Goldberg
Assistant Examiner—Carl J. Arbes
Attorney, Agent, or Firm—Helfgott & Karas

[57] ABSTRACT

A method of mounting surface-mounted type electronic components on a printed circuit board adapted to be carried out using an electronic component series which comprises a carrier tape formed with a plurality of tiny recess portions for receiving therein adhesives for use in temporary fixing of surface-mounted type electronic components on a printed circuit board, adhesives received in the respective recess portions, and a plurality of surface-mounted type electronic components held on the carrier tape through the adhesives. In the present invention, the taking up of the electronic component from the carrier tape is performed while pushing up the tiny recess portion of the carrier tape to cause the same portion to be deformed, so that the electronic component can be easily removed together with the adhesive from the carrier tape, and the removed electronic component is then placed on a printed circuit board to be temporarily held on the printed circuit board through the adhesive having adhered on the bottom surface of the electronic component.

8 Claims, 4 Drawing Sheets

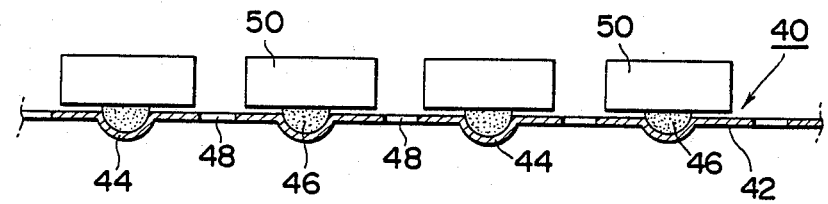
F I G. 1
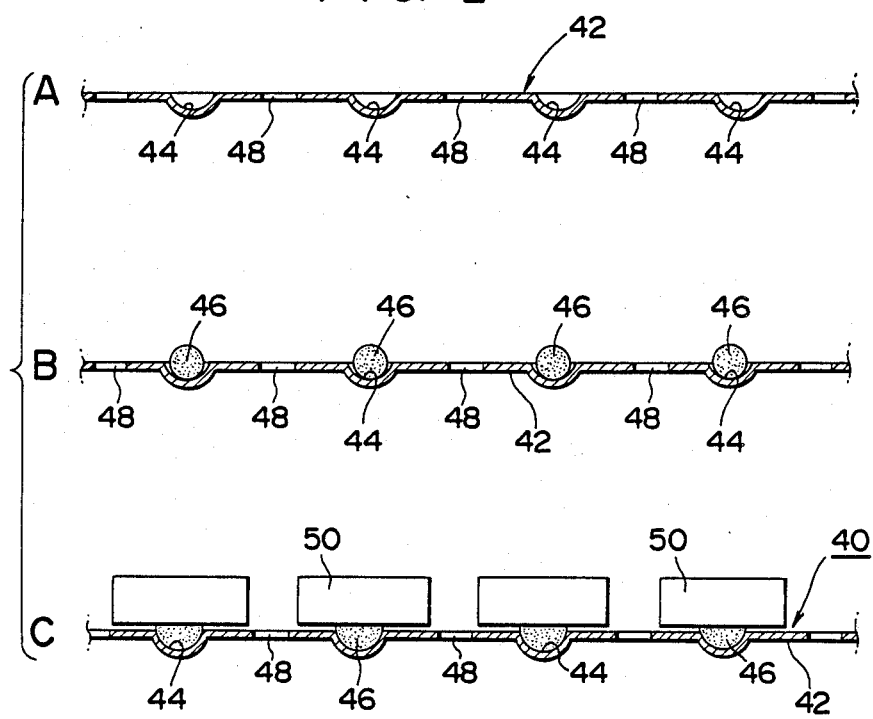
F I G. 2

METHOD OF MOUNTING SURFACE-MOUNTED TYPE ELECTRONIC COMPONENTS ON A PRINTED CIRCUIT BOARD

BACKGROUND OF THE INVENTION

1. Field of the Invention

This invention relates to a method of mounting surface-mounted type electronic components (hereinafter referred to as "chips") on a printed circuit board, and more particularly to a chip mounting method in which temporary fixing of chips onto a printed circuit board with adhesives is carried out before the chips are practically mounted on the printed circuit board in a manner such that external terminals of the chips are soldered to conductive patterns which are previously formed on the printed circuit board.

2. Description of the Prior Art

Some methods of mounting chips on a printed circuit board by soldering comprises the steps of temporarily fixing chips onto a printed circuit board prior to soldering operation.

An example of an electronic component series comprising chips such as chip-type capacitors which are adapted to be temporarily held on a printed circuit board with adhesives prior to soldering operation is found, for example, in Japanese Utility Model Registration No. 1405587 (Japanese Utility Model Publication No. 11438/1981) to TDK Corporation. This electronic component series comprises a tape extending in a longitudinal direction, a thermosetting adhesive applied onto a flat surface of the tape, and a plurality of chips held on the tape through the thermosetting adhesive. The electronic component series is adapted to be moved in the longitudinal direction by any suitable feeding means of an automatic chip mounting apparatus to successively transfer each of the chips to a chip removing position, each of which chips is then removed from the tape at the same position by means of a suction head incorporated in the automatic chip mounting apparatus. The removed chip is then placed on a predetermined position of a printed circuit board by means of the suction head. As a result, the chip may be temporarily held on the predetermined position of the printed circuit board through the thermosetting adhesive which may adhere to the side of the chip when the chip is removed from the tape. However, in the conventional electronic component series, it is hard to remove or extract a chip from the tape by the suction head because the chip is tenaciously held at the whole bottom surface thereof on the flat surface of the tape through the thermosetting adhesive. Even when a chip is released from the tape, it pulls the tape through the adhesive during the peeling-off operation. This results in the tape acting on chips adjacent to the released one when it elastically returns to the original position, thereby causing them to be separated from the tape. In addition, there is a possibility that the adhesive will fail to adhere to the side of a chip, when the chip is removed from the tape, to remain on the tape. This renders firm fixing of the chip on a printed circuit board impossible.

SUMMARY OF THE INVENTION

The present invention has been made in view of the foregoing disadvantage of the prior art.

It is therefore an object of the present invention to provide a method of mounting chips on a printed circuit board, which is efficiently performed utilizing an electronic component series which comprises a carrier tape and a plurality of chips held on the carrier tape through adhesives.

It is another object of this invention to provide a chip mounting method as stated above, which is capable of facilitating removing of chips together with adhesives from a carrier tape to cause the chips to be firmly temporarily held on a printed circuit board through the adhesives prior to soldering of the chips to the printed circuit board.

In accordance with this invention, there is provided a method of mounting chips on a printed circuit board, comprising the steps of preparing an electronic component series which comprises a flexible carrier tape extending in a longitudinal direction, a plurality of chips arranged on an upper surface of the carrier tape at equal intervals in a row, at least one tiny recess portion formed in a manner to be swelled in the downward direction from the carrier tape at a portion of the carrier tape on which each of the chips is arranged, and adhesives received in respective recess portions of the carrier tape on which the respective electronic components are arranged, the chips being held on the carrier tape through the adhesives received in the respective recess portions; advancing the electronic component series to forward each of the chips to a position at which each the chip is to be removed from the carrier tape; taking up each the chip from the carrier tape, when the chip is at the removing position, while pushing up at least one recess portion of the carrier tape on which the chip is held, to cause the at least one recess portion to be deformed, thereby facilitating the removal of the chip together with an adhesive received in the at least one recess portion from the carrier tape; and placing the removed chip on a printed circuit board, whereby the chip can be temporarily held on the printed circuit board through the adhesive having adhered on the bottom surface of the chip.

Each of the recess portions may be formed into a substantially hemispherical shape. When the substantially hemispherically shaped recess portion is pushed up, it is reversed in a manner to actively project in an upward direction.

The adhesive received in each of the recess portions may be formed of a polymeric material selected from the group consisting of silicone, an acrylic resin and the mixture thereof, which has the property of exhibiting adhesion upon being heated. After the chip is removed from the carrier tape, the adhesive having adhered on the bottom surface of the removed chip is subjected to heating treatment, whereby the adhesive exhibits adhesion. The heating treatment may be carried out by applying hot air to the adhesive.

The carrier tape may be provided with a plurality of concavities at equal intervals along the longitudinal direction of the carrier tape to form hollows for receiving chips therein. The at least one recess portion is formed at a bottom of each the concavity in a manner to be swelled in the downward direction from the bottom of the concavity. Further, the adhesive is received in the recess portion of each the concavity. Furthermore, the chip is received in each the concavity to be held on the bottom surface of the concavity through the adhesive received in the recess portion of the concave.

BRIEF DESCRIPTION OF THE DRAWINGS

These and other objects and many of the attendant advantages of the present invention will be readily appreciated as the same becomes better understood by reference to the following detailed description when considered in connection with the accompanying drawings, in which like reference numerals designate the same parts throughout the Figures and wherein:

FIG. 1 is a schematic sectional view of one example of an electronic component series which is prepared in a method according to an embodiment of this invention;

FIGS. 2A to 2C are schematic sectional views of assistance in explaining the manner of manufacturing the electronic component series shown in FIG. 1;

DETAILED DESCRIPTION OF THE PREFERRED EMBODIMENT

Figure 3:
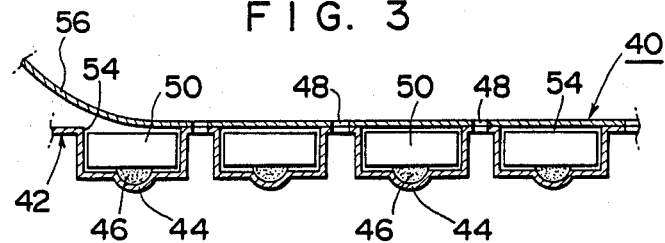
FIG. 3 is a schematic sectional view of another example of an electronic component series which is prepared in the method according to the embodiment.

Referring to FIG. 1, one example of an electronic component series 40 prepared in a method of mounting electronic components on a printed circuit board according to an embodiment of the present invention, which comprises a flexible carrier tape 42 which is made of soft resin material such as polypropylene or the like and extends in a longitudinal direction, the carrier tape 42 being formed with a plurality of tiny recess portions 44 which are arranged at equal intervals along the longitudinal direction of the carrier tape 42 and swelled in the downward direction from the carrier tape 42, each of which recess portions 44 has a substantially hemispherical shape; an adhesive 46 received in each recess portion 44 of the carrier tape 42 and for use in temporary fixing of a chip onto a printed circuit board; and a plurality of chips 50 held through the adhesives 46 on respective portions of the carrier tape 42 at which the recess portions 44 are formed. The carrier tape 42 further includes a plurality of feeding perforations 48 which are formed at equal intervals along the longitudinal direction of the carrier tape 42. The feeding perforations 48 are used in order to forward each of the chips 50 on the carrier tape 42 to a position at which a chip 50 is to be removed from the carrier tape 42 by means of a suction head (described in greater detail hereinafter).

Referring to FIGS. 2A to 2C, description will be made of the manner of producing the electronic component series 40 shown in FIG. 1. In FIG. 2A, recess portions 44 are formed by, for example, embossing predetermined portions of a sheet of a carrier tape 42, and feeding perforations 48 are formed by, for example, punching other predetermined portions of the carrier tape sheet 42. In FIG. 2B, a softened adhesive 46 is filled into each recess portion 44 of the carrier tape sheet 42. Then, a plurality of chips 50 are arranged on the carrier tape sheet 42 at equal intervals in a row in a manner to be contacted with the respective adhesives 46 filled in the respective recess portions 44, whereby the chips 50 are held on the carrier tape 42 through the adhesives 46 so as not to cause the adhesives 46 to be exposed.

FIG. 3 shows another example of an electronic component series 42 prepared in the method according to the embodiment of the present invention. In this example, a carrier tape 42 has a plurality of concavities 54 at equal intervals along the longitudinal direction of the carrier tape 42 to form hollows for receiving chips 50 therein, and has a tiny recess portion 44 formed at a bottom of each concavities 54 in a manner to be swelled in the downward direction from the bottom of concavity 54, in each of which recess portions 44 an adhesive 46 is received. Through the adhesive 46, a chip 50 received within each concavity 54 is held on the inner bottom surface of the concavity 54. This example comprises an additional cover tape 56 which is stuck onto an upper surface of the carrier tape 42 to cover the respective concavities 54, but the cover tape 56 may be omitted. In this example, feeding perforations 48 are formed by, for example, punching predetermined portions of the assembly of the carrier tape 42 and cover tape 56.

The adhesive 46 employed in the electronic component series 40 shown in FIGS. 1 and 2 is preferably formed of a polymeric material which is selected from the group consisting of silicone, an acrylic resin and the mixture silicon and acrylic resin which has the property of exhibiting adhesion upon being heated to about 80° C.

Figure 4:
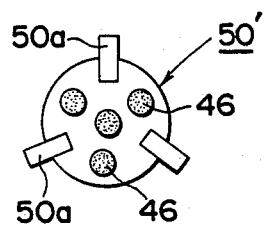
FIGS. 4 and 5 are schematic bottom views showing examples of chips which may be employed in the electronic component series shown in FIGS. 1 and 3, and showing the examples when are removed from carrier tapes of the electronic component series shown in FIGS. 1 and 3.
Figure 5:
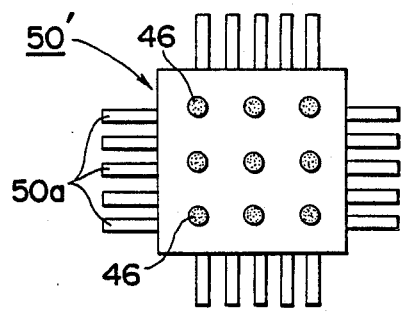
Figure 6A:
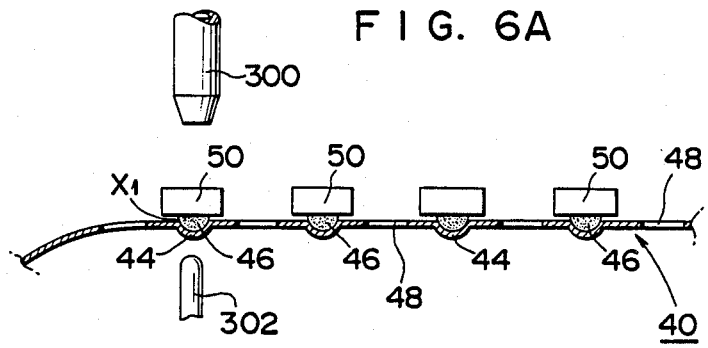
FIGS. 6A to 6D are schematic sectional views of assistance in explaining the manner of removing a chip from the carrier tape of the electronic component series shown in FIG. 1.
Figure 6B:
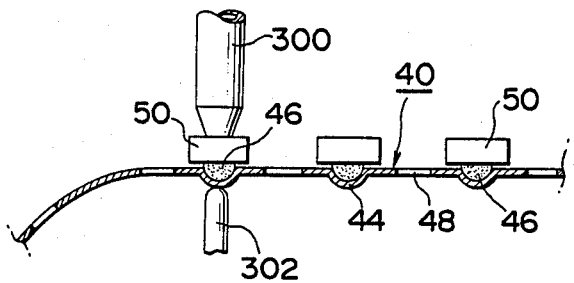
Figure 6C:
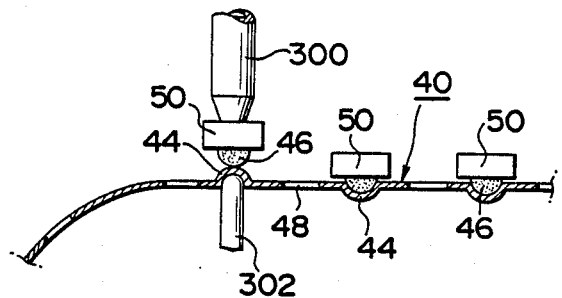
Figure 6D:
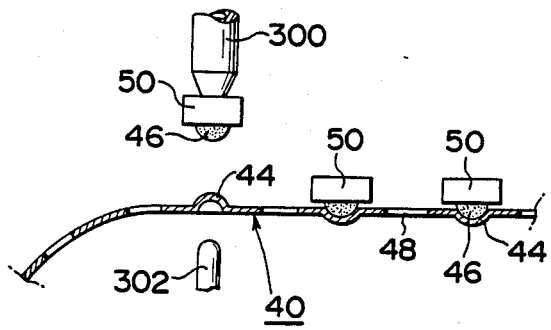

Incidentally, some chips are provided with three leads 50a as shown in FIG. 4 or provided with leads 50a like crab legs as shown in FIG. 5. When such chips 50' having a lot of leads as these are mounted on a printed circuit board, it is desirable that temporary fixing of the chips 50' onto the printed circuit board should be carried out in a manner to cause the chips 50' to be bonded at a plurality points on their bottom surfaces to the printed circuit board with adhesives. Accordingly, when such chips 50' are treated in the method of the present invention, it is desirable to construct an electronic component series 40 in a manner such that a cluster of tiny recess portions (identical to the portions 44 shown in FIGS. 1 and 3) is formed at a portion of a carrier tape on which each chip 50' is to be arranged, adhesives are received in the respective clusters of the recess portions, and the chips 50' are then located on the carrier tape so as to be contacted with the adhesives received in the respective clusters of the recess portions so that they are held on the carrier tape through the adhesives. When a chip 50' is removed from the so-constructed electronic component series in the manner as described hereinafter, the adhesives 46 are also removed from the carrier tape in a state of adhering on the bottom surface of the removed chip 50' as shown in FIGS. 4 and 5. Thus, even when the chips 50' having leads 50a as shown in FIGS. 4 and 5 are treated, it is possible to accomplish the firmly temporary fixing of the chips 50' on a printed circuit board.

The electronic component series 40 of FIGS. 1 and 3 constructed as stated above is spirally wound around a reel (not shown). The reel having the electronic component series 40 spirally wound therearound, when it is used, is installed in an apparatus (not shown) for automatically mounting chips on printed circuit boards. In the mounting apparatus, any suitable feeding means, e.g., teeth of a feed wheel are engaged with the feeding perforations 48 of the electronic component series 40 to cause the electronic component series 40 to be drawn out from the reel with rotation of the feed wheel, whereby each of chips 50 or 50' on the carrier tape 42 is forwarded to a position at which each of chips 50 or 50' on the carrier tape 42 is to be removed from the carrier tape 42. Incidentally, in cases where the electronic component series 40 shown in FIG. 3 is used, the cover tape 56 is peeled from the carrier tape 42 by any suitable means, e.g., a takeup drum, during the electronic component series 40 is moved tward the chip removing position.

Figure 7:
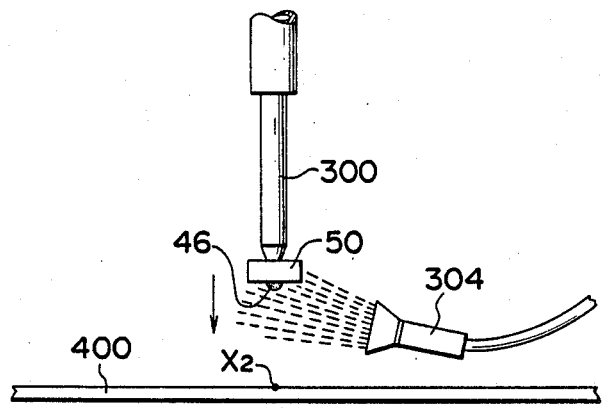
FIG. 7 is a schematic view of assistance in explaining the manner of heating an adhesive which is formed of a polymeric material and has adhered to a chip removed from the carrier tape.

Referring to FIG. 6, the manner of removing of chips 50 from the carrier tape 42 of the electronic component series 40 shown in FIG. 1 will be described. In FIG. 6, a reference numeral 300 designates a suction head which is incorporated into an automatic chip mounting apparatus (not shown) and which serves to remove the chips 50 one by one from the electronic component series 40 by suction to place them on a printed circuit board. The suction head 300 is connected to an air-absorbing source (not shown) for sucking the chips 50 one by one from the electronic component series 40. Further, the suction head 300 is adapted to be moved vertically with respect to the electronic component series 40 and a printed circuit board. Furthermore, the suction head 300 is adapted to be moved between a position X1 at which each of the chips 50 is to be removed from the carrier tape 42 of the electronic component series 40 and a position X2 at which each of so-removed chips 50 is to be mounted held on a printed circuit board, and is normally at a position right above the chip removing position X1. The above-mentioned movements of the suction head 300 are carried out by any suitable means, e.g., reciprocating cylinder means. Arranged at a position right below the chip removing position X1 is an ejector pin 302 which is adapted to be moved vertically with respect to the electronic component series 40. The ejector pin 302 is normally at a downward position. In FIG. 6A, the electronic component series 40 is drawn out from the unshown reel having the electronic component series 40 wound therearound by the unshown feeding means to be moved in the longitudinal direction, whereby the foremost one of the chips 50 on the carrier tape 42 reaches the chip removing position X1. At this time, the suction head 300 is moved downwardly to be contacted at its lower end with the chip 50 and then holds it by suction as shown in FIG. 6B. Thereafter, the suction head 300 having the chip 50 held thereby is moved upwardly in order to remove the chip 50 from the carrier tape 42. Simultaneously with the upward movement of the suction head 300, the ejector pin 302 is moved upwardly to push up a recess portion 44 of the carrier tape 42 on which the chip 50 is held through an adhesive 46 received in the recess portion 44. At this time, with the pushing motion of the ejector pin 302, the recess portion 44 is reversed in a manner such that the bottom portion of the recess portion 44 actively projects upwardly as shown in FIG. 6C, since the carrier tape 42 is made of a flexible resin material as described above. Thus, the chip 50 is easily removed from the carrier tape 42 by the upward movement of the suction head 300 as shown in FIG. 6D. Naturally, the adhesive 46 is also removed, in a state of adhering on the bottom surface of the chip 50, from the carrier tape 50. Thereafter, the suction head 300 having the chip 50 held thereon by suction is moved to the chip mounting position X2 to place the chip 50 on a printed circuit board 400 (FIG. 7), resulting in the chip 50 being temporarily bonded onto the printed circuit board 400 through the adhesive 46 having adhered on the bottom surface of the chip 50. Incidentally, in cases where the adhesive 46 is formed of a polymeric material as described above, the adhesive 46 having adhered on the bottom surface of the chip 50 is subjected to a heating treatment before the suction head 300 is moved downwardly to cause the chip 50 to be placed on the printed circuit board 400. The heating treatment may be carried out using hot air ejected from a hot air ejection nozzle 304 as shown in FIG. 7. The heating treatment may be carried out using, as the hot air, air heated to a temperature of about 80° C., resulting in the adhesive 46 exhibiting adhesion. Thus, the chip 50 is temporarily bonded on the printed circuit board 400, using the adhesion of the heated adhesive 46. Also, the heating treatment may be performed utilizing means for irradiating heat beam, a heating oven or a heater.

Incidentally, in cases where a chip 50' shown in FIGS. 4 and 5 is removed from the carrier tape 42 having chips 50' held thereon, a cluster of recess portions of the carrier tape on which the chip 50' is held may be pushed up, by a plurality of ejector pins corresponding in number to the recess portions, in the above-mentioned manner.

The above-described procedure is repeated to temporarily fix a predetermined number of chips on a printed circuit board. Thereafter, the printed circuit board is transferred to a station for soldering. In the soldering step, the chips are practically fixed on the printed circuit board by soldering external terminals of the chips to the printed circuit board.

Thus, it will be noted that a method of mounting chips on a printed circuit board according to the present invention is capable of easily removing chips together with adhesives from an electronic component series to temporarily fix them on a printed circuit board with the adhesives having adhered on the bottom surfaces of the removed chips.

While a preferred embodiment of the present invention has been described with a certain degree of particularity with reference to the drawings, obvious modifications and variations are possible in the light of the above teachings. It is therefore to be understood that within the scope of the appended claims, the invention may be practiced otherwise than as specifically described.

What is claimed is:

1. A method of mounting surface-mounted type electronic components on a printed circuit board, comprising the steps of:

preparing an electronic component series which comprises a flexible carrier tape extending in a longitudinal direction, a plurality of surface-mounted type electronic components arranged on an upper surface of said carrier tape at equal intervals in a row, at least one tiny recess portion formed in a manner to be swelled in the downward direction from said carrier tape at a portion of said carrier tape on which each of said electronic component is arranged, and adhesives received in respective recess portions of said carrier tape on which said respective electronic components are arranged, said electronic components being held on said carrier tape through said adhesives received in said respective recess portions;

advancing said electronic component series to forward each of said electronic components to a position at which each said chips is to be removed from said carrier tape;

taking up each said electronic component from said electronic component series, when said electronic component is at said electronic component removing position, while pushing up at least one recess portion of said carrier tape on which said electronic component is held, to cause said at least one recess portion to be deformed, thereby facilitating the removal of said electronic component together with an adhesive received in said at least one recess portion from said carrier tape; and placing said removed electronic component on a printed board, whereby said electronic component can be temporarily held on said printed circuit board through said adhesive having adhered on the bottom surface of said electronic component.

2. A method of mounting surface-mounted type electronic components on a printed circuit board as defined in claim 1, wherein each of said recess portions is formed into a substantially hemispherical shape and wherein said step of pushing up at least one recess portion of said carrier tape on which said electronic component is held, to cause said at least one recess portion to be deformed comprises the step of causing said at least one recess portion to be reversed in a manner to actively project in an upward direction.

3. A method of mounting surface-mounted type electronic components on a printed circuit board as defined in claim 1, wherein each of said adhesives is formed of a polymeric material selected from the group consisting of silicone, acrylic resin, and the mixture of silicon with acrylic resin, said material having the property of exhibiting adhesion upon being heated, and wherein the method further comprises the step of applying heat, after said electronic component taking up step, to said adhesive having adhered on the bottom surface of said removed electronic component to cause it to exhibit adhesion.

4. A method of mounting surface-mounted type electronic components on a printed circuit board as defined in claim 3, wherein said heat applying step is performed by applying hot air to said adhesive.

5. A method of mounting surface-mounted type electronic components on a printed circuit board as defined in claim 1, wherein said carrier tape further has a plurality of concavities at equal intervals along the longitudinal direction of said carrier tape to form hollows for receiving surface-mounted type electronic components therein, wherein at least one tiny recess portion is formed at a bottom of each of said concavities in a manner to be swelled in the downward direction from the bottom of each of said concavities, wherein an adhesive is received in at least one tiny recess portion of each of said concavities, and wherein an surface-mounted type electronic component is received in each of said concavities to be held on the bottom surface of each of said concavities through an adhesive received in at least one tiny recess of said each concavity.

6. A method of mounting surface-mounted type electronic components on a printed circuit board as defined in claim 5, wherein each of said recess portions is formed into a substantially hemispherical shape and wherein said step of pushing up at least one recess portion of said carrier tape on which said electronic component is held, to cause said at least one recess portion to be deformed comprises the step of causing said at least one recess portion to be reversed in a manner to be actively project in an upward direction.

7. A method of mounting surface-mounted type electronic components on a printed circuit board as defined in claim 5, wherein each of said adhesives is formed of a polymeric material selected from the group consisting of silicone, acrylic resin, and the mixture of silicon with acrylic resin, said material having the property of exhibiting adhesion upon being heated, and wherein the method further comprises the step of applying heat, after said electronic component taking up step, to said adhesive having adhered on the bottom surface of said removed electronic component to cause it to exhibit adhesion.

8. A method of mounting surface-mounted type electronic components on a printed circuit board as defined in claim 5, wherein said heat applying step is performed by applying hot air to said adhesive.

* * * * *